(12) United States Patent
Köllmann et al.

(10) Patent No.: US 8,531,228 B2
(45) Date of Patent: Sep. 10, 2013

(54) BIDIRECTIONAL INPUT/OUTPUT CIRCUIT

(75) Inventors: Andreas Johannes Köllmann, Rosengarten (DE); Steffen Rode, Lüneburg (DE)

(73) Assignee: NXP B.V., Eindhoven (NL)

( * ) Notice: Subject to any disclaimer, the term of this patent is extended or adjusted under 35 U.S.C. 154(b) by 135 days.

(21) Appl. No.: 13/037,866

(22) Filed: Mar. 1, 2011

(65) Prior Publication Data

US 2012/0223758 A1    Sep. 6, 2012

(51) Int. Cl.
*H03L 5/00*     (2006.01)

(52) U.S. Cl.
USPC .......................................................... 327/333

(58) Field of Classification Search
None
See application file for complete search history.

(56) References Cited

U.S. PATENT DOCUMENTS

| | | | | |
|---|---|---|---|---|
| 5,280,526 A * | 1/1994 | Laturell | | 379/405 |
| 5,801,549 A * | 9/1998 | Cao et al. | | 326/83 |
| 7,564,275 B2 * | 7/2009 | Bien | | 327/109 |
| 8,149,015 B2 * | 4/2012 | Choi | | 326/30 |

* cited by examiner

*Primary Examiner* — Lincoln Donovan
*Assistant Examiner* — Khareem E Almo

(57) ABSTRACT

Level-shifting devices and methods allow signals to be passed between input/output (I/O) ports. One such device comprises a first output driver that drives a first I/O port in response to a first control signal. A second output driver drives a second I/O port in response to a second control signal. A first comparator circuit, responsive to a first reference voltage and a voltage at the first I/O port, generates the second control signal. A limiter circuit limits driving of the second I/O port, by the second driver, to a limiting voltage that responsive to a the second I/O port over a first range of signaling voltages, and constrained to a set value over a second range. A voltage reference generating circuit generates a second reference voltage. A second comparator circuit generates the first control signal in response to the second reference voltage and the second I/O port.

12 Claims, 5 Drawing Sheets

BIDIRECTIONAL INPUT/OUTPUT CIRCUIT

Aspects of the present disclosure are directed toward a bidirectional input/output (I/O) circuit that can be used to pass signals between I/O ports. In certain embodiments, the I/O ports can operate at different signal levels.

Interfaces designed for standards such as inter-integrated circuit (I2C) or consumer electronics control (CEC) can use supply levels that are not supported by modern integrated circuit (IC)-technologies. Accordingly, level-shifting components can be used to interface the modern IC-technologies with external signaling corresponding to such standards. For instance, some the operating voltages of certain (legacy) interfaces can be relatively high, e.g., 5V, while the operating voltage of the IC-technology may be relatively low, e.g., 1.8V (or lower) signal. Passive integration of level-shifters for such applications can exhibit various problems. One such problem relates to the capacitive load of the circuit. In some instances, a capacitive load on either side of a passive level-shifter is seen by all drivers connected to the external bus. Consequently, the drivers can experience a larger capacitive load and the effective output impedance is further increased by the ON-impedance of the level shifter. This can lead to slewing of signals.

An active buffer implementation of a level-shifter can be useful for decoupling load capacitance and also provide ESD protection. Furthermore, the circuit behavior, relative to the external bus, is less-dependent on the internal bus/circuit-implementation.

A drawback of an active buffer implementation is its possibility to create a deadlock situation, i.e., where the circuit is unable to distinguish between the states created by the level-shifter or by external drivers. When the I/O is implemented using, for example, an open drain bus, it can be difficult to distinguish between a signal being driven externally and a signal being driven by the local I/O circuit. The internal driving of one bus may result in the I/O circuit erroneously detecting an external signal on that bus and then drive the other bus. This can cause a deadlock situation in which both busses are driven low and held low by the I/O circuit. If the external driver releases the bus, the low state will remain and the bus would be locked until the supply of the level-shifter is removed.

Embodiments of the present disclosure relate to an IO-circuit that is configured to support open-drain based busses with a wide range of supported supply levels.

Consistent with one embodiment of the present disclosure, a bidirectional level-shifting device for passing signals between input/output (I/O) ports having different signaling levels is provided. The device has a first output driver configured and arranged to drive a first I/O port in response to a first control signal. A second output driver is configured and arranged to drive a second I/O port in response to a second control signal. A first comparator circuit, responsive to a first reference voltage and a voltage at the first I/O port, generates the second control signal. A limiter circuit configured limits driving of the second I/O port, by the second driver, to a limiting voltage that is adjusted according to a signaling level of the second I/O port over a first range of signaling voltages, and constrained to a set value over a second range of signaling voltages. A voltage reference generating circuit generates a second reference voltage. A second comparator circuit generates the first control signal in response to a comparison between the second reference voltage and the second I/O port.

Consistent with another embodiment of the present disclosure, a method is provided for use with a bidirectional level-shifting device for passing signals between I/O ports having different signaling levels. The method includes the use of a first output driver to drive a first I/O port in response to a first control signal. A second output driver is used to drive a second I/O port in response to a second control signal. A first comparator circuit, responsive to a first reference voltage and a voltage at the first I/O port, is used to generate the second control signal. A limiter circuit arranged to limit driving of the second I/O port, by the second driver, is used to a limiting voltage that is adjusted according to a signaling level of the second I/O port over a first range of signaling voltages, and constrained to a set value over a second range of signaling voltages. A voltage reference generating circuit is used to generate a second reference voltage. A second comparator circuit is used to generate the first control signal in response to a comparison between the second reference voltage and the second I/O port.

According to another embodiment, a bidirectional level-shifting device is provided for passing signals between I/O ports having different signaling levels. The device includes first means for driving a first I/O port in response to a first control signal. Second means drive a second I/O port in response to a second control signal. Third means, responsive to a first reference voltage and a voltage at the first I/O port, generate the second control signal. Fourth means limit driving of the second I/O port, by the second means, to a limiting voltage that is adjusted according to a signaling level of the second I/O port over a first range of signaling voltages, and constrained to a set value over a second range of signaling voltages. Fifth means generate a second reference voltage. Sixth means generate the first control signal in response to a comparison between the second reference voltage and the second I/O port.

The above discussion is not intended to describe each embodiment or every implementation. The figures and following description also explicitly describe various embodiments and other embodiments, modifications, equivalents, and alternatives fall within the spirit and scope of the disclosure.

Various example embodiments may be more completely understood in consideration of the following detailed description in connection with the accompanying drawings, in which.

Figure 1:
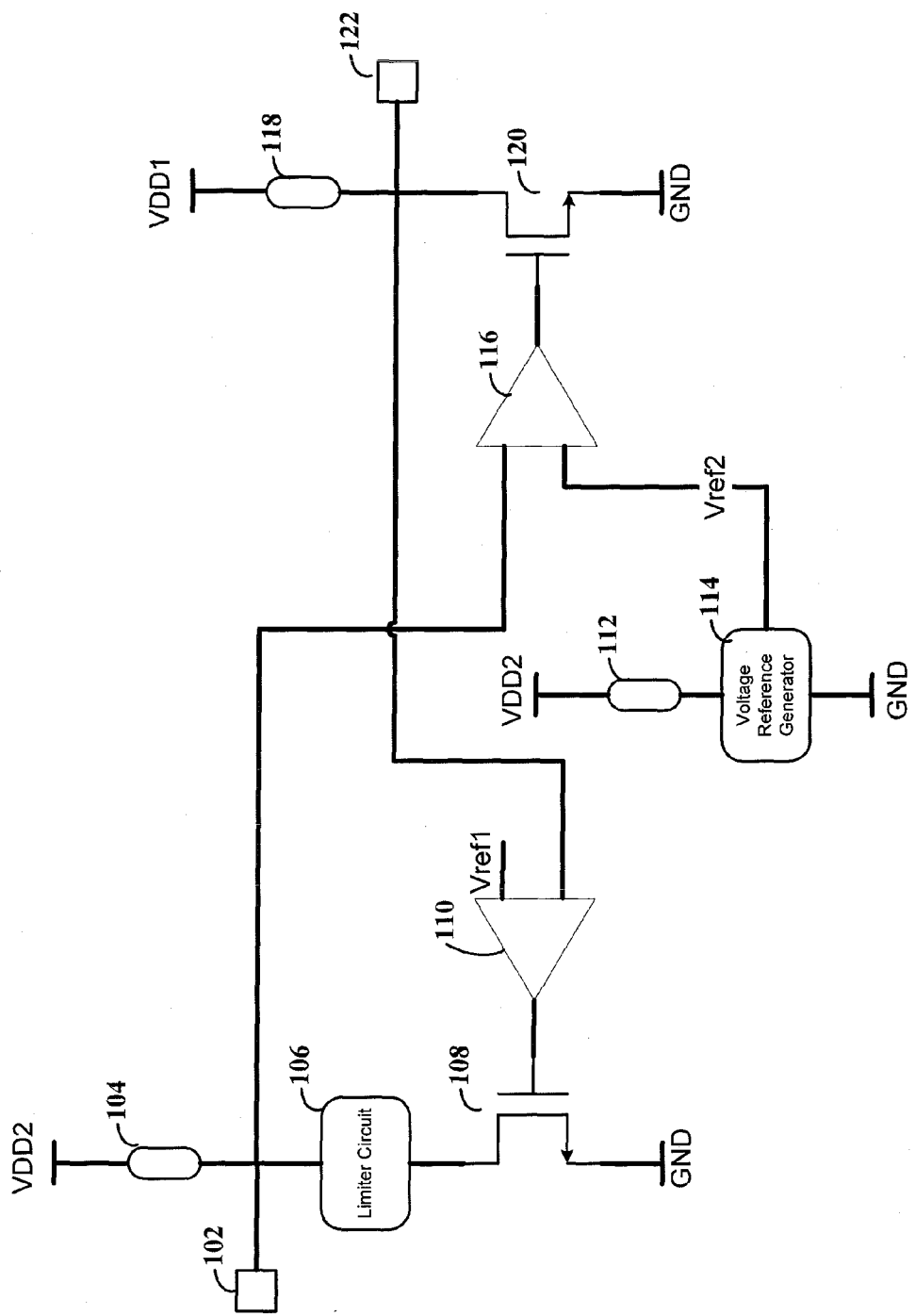
FIG. 1 depicts a circuit diagram for an I/O device, consistent with embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The various disclosed embodiments are believed to be applicable to a variety of different types of processes, devices, and arrangements for use with various driver protocols (e.g., I2C or CEC, as only non-limiting examples). While the embodiments are not necessarily so limited, various aspects of the disclosure may be appreciated through a discussion of examples using this context.

Consistent with an embodiment of the present disclosure, a bidirectional I/O device is configured to operate over a wide range of operating voltages and for two different signaling busses. The I/O device includes driver circuits that are configured to drive the busses in response to determining that an external signal (relative to the I/O device) is present on the other bus. To make this determination, the I/O circuit compares the voltage on one of the signaling busses to a reference voltage. The reference voltage is set to allow an externally-driven signal to be distinguished from an internally-driven signal. The ability to distinguish is accomplished by limiting the internal driving of the bus to a limiting voltage that is above the reference voltage that is above a voltage corresponding to when the bus is driven externally. As discussed in more detail herein, the limiting voltage sets the voltage output low (Vol) for the internal driver circuit. Thus, the reference voltage sits between the limiting voltage and the externally-driven voltage. For low operating voltages, the limiting voltage is adjusted according to the operating voltages. For higher operating voltages, however, the limiting voltage is a set voltage.

Consistent with certain embodiments of the present disclosure, the reference voltage is adjusted in a manner similar to that of the limiting voltage. Thus, the limiting voltage and reference voltage largely track with each other. For instance, the reference voltage can be adjusted according to the operating voltages for low operating voltages. For high-operating voltages, the reference voltage can be a set voltage. The reference voltage can thus be configured so that, for all (or substantially all) values of the operating voltage, the reference voltage is always lower than the limiting voltage.

According to one embodiment of the present disclosure, a limiting circuit creates a voltage drop between an I/O port and a corresponding driver component. This voltage drop limits the driver component from driving the I/O port below the voltage drop. As such, the voltage drop represents the limiting voltage (Vol) for the device. The limiting circuit includes a first set of circuit elements that generates a voltage drop that has a value that is responsive to the operating voltage. A second set of circuit elements limit the voltage drop to a set (or maximum) value that is substantially non-responsive to increases in operating voltage, thereby overriding the first set of circuit elements when the operating voltage is at a high voltage.

Turning now to the figures, FIG. 1 depicts a circuit diagram for an I/O device, consistent with embodiments of the present disclosure. The I/O device passes signals originating from one of the I/O ports 102 and 122 to the other of the I/O ports. Thus, if an external driver drives I/O port 122 to a low value, the I/O device will drive I/O port 102 to a low value. When the external driver releases I/O port 122, the I/O device will release I/O port 102. I/O ports 102 and 122 operate at operating voltages VDD2 and VDD1, respectively. Elements 104, 118 (e.g., resistors), pull the I/O ports to their respective operating voltages in the absence of the ports being driven.

Output drivers 108 and 120 operate to drive ports 102 and 122, respectively. When active, the output drivers 108, 120 source current from the I/O ports to ground to lower the voltage on the I/O ports. This type of driver configuration is sometimes referred to as an open-drain bus and can be particularly useful for bidirectional buses and with multiple devices on the bus. This type of driver configuration can also be particularly useful for use with a variety of different operating voltages and with the different operating voltages being provided external to the driver circuit. For instance, the driver circuit can operate at a different operating voltage by changing VDD2 and/or VDD1.

In order to pass an incoming signal one of the I/O ports 102, 122 to the other of the I/O ports, the I/O device uses two comparator circuits 110 and 116. These comparator circuits 110, 116 detect when I/O ports 122 and 102 (respectively) are driven low by an external driver. In the event that comparators circuits 110, 116 detect externally driven signals, they provide control signals to enable output drivers 108 and 120, respectively.

With reference to comparator 110, the voltage at the I/O port 122 is compared to a first reference voltage (Vref1), where Vref1 is set between VDD1 and GND. In particular embodiments, Vref1 is set according to the maximum input low voltage desired for this port 122 of the I/O device (Vil). When the voltage at the I/O port 122 is higher than Vref1, the comparator 110 generates a control signal that disables output driver 108. When the voltage at the I/O port 122 is lower than Vref1, the comparator 110 generates a control signal that enables output driver 108. In this manner, a signal that is received on I/O port 122 is transferred to I/O port 102.

With reference to comparator 116, the voltage at the I/O port 102 is compared to a second reference voltage (Vref2), where Vref2 is set between VDD2 and GND. In particular embodiments, Vref2 can be set according to the maximum input low voltage desired for the corresponding port 102 of the I/O device (Vil). When the voltage at the I/O port 102 is higher than Vref2, the comparator 116 generates a control signal that disables output driver 120. When the voltage at the I/O port 102 is lower than Vref2, the comparator 116 generates a control signal that enables output driver 120. In this manner, a signal that is received on I/O port 102 is transferred to I/O port 122.

It has been recognized that I/O devices can be subject to deadlock situations. For instance, if the internal driving of each of the I/O ports 102 and 122 results in a detection of an external signal, the I/O device will cause both I/O ports to be constantly driven. Accordingly, aspects of the present disclosure are directed toward the use of a limiter circuit 106. This limiter circuit 106 limits the driving capabilities of output driver 108. This results in a Vol for the output driver 108 that is higher than the Vol for external drivers. Thus, comparator 116 can be configured to enable output driver 120 in response to the lower Vol of the external drivers but not for the higher Vol, which is responsive to the limiter circuit 106. This can be accomplished using voltage reference generator 114 to set Vref2 between these two Vols. Reference generator can (optionally) be tied to VDD2 through element 112 (e.g., a resistor or a current source).

It has also been recognized that it can be desirable to determine the Vol set by limiter circuit 106 as a function of the operating voltage VDD2. For instance, a high value of Vol may frustrate level shifting for small supply levels of VDD2 because Vol may become undesirably large (e.g., when measured as a percentage of VDD2). If, for example, Vol is above the Vil of a receiver device, data loss may occur. The Vil of a receiver designed for an operating level around 3V could be higher than the Vil of a receiver designed for an operating level around 1.8V or 1.2V. Accordingly, embodiments of the present disclosure vary the Vol set by limiter circuit 106 based upon the value of VDD2.

It has also been recognized that it can be desirable to keep the Vol set by limiter circuit 106 below an upper (e.g., maximum) value. For instance, the Vil of receivers may not necessarily increase beyond a certain level, regardless of further increases in the operating voltage. Accordingly, aspects of the present disclosure are directed toward keeping the Vol of the limiter circuit 106 below a set value.

According to certain embodiments of the present disclosure, the adjustable nature of the Vol set by limiter dominates up until the Vol nears or reaches the upper limit For operating voltages higher than this point, the Vol is set at the upper limit Various embodiments of the present disclosure related to the generation of the second reference voltage Vref2. The voltage reference generator 114 can be configured to ensure that Vref2 is less than the Vol set by limiter circuit 106. It has been recognized that it can be advantageous not to set the value of Vref2 to the lowest possible value, e.g., as this might result in unwanted signal delay through the I/O device. For a given input signal on I/O port 102 a higher Vref2 voltage will result in an earlier trip point for comparator 116. Thus, the lower the Vref2 value, the longer the delay can be through the device. According to a certain embodiments of the present disclosure, Vref2 is configured to track the Vol set by limiter circuit 106.

Consistent with various embodiments, the limiter circuit 106 can be connected between ground and the output driver 108. When the I/O-driver is enabled, the limiter circuit 106 would generate a voltage drop that would limit the voltage to which the I/O driver. Although such embodiments may not be expressly depicted in the figures, the present disclosure contemplates this and other variations relative to the figures and related discussion contained herein.

Figure 2:
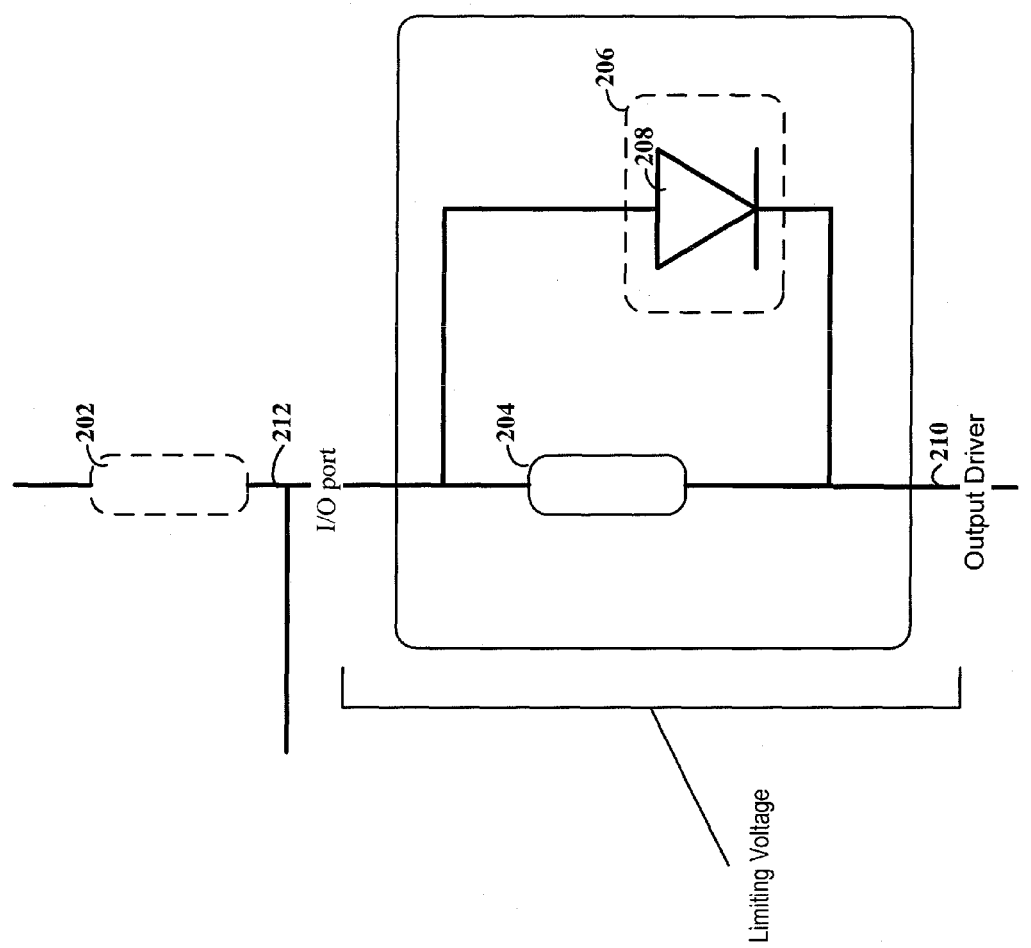
FIG. 2 depicts a limiter circuit, consistent with an embodiment of the present disclosure.

FIG. 2 depicts a limiter circuit, consistent with an embodiment of the present disclosure. This limiter circuit is connected between an I/O port and a corresponding output driver. The output driver is configured to provide a low voltage (e.g., ground) in response to a control signal. The limiter circuit creates a voltage between the I/O port and the output driver thereby limiting the voltage on the I/O port when driven by the output driver. For example, the output driver can be configured using a transistor that is connected to ground. When the output driver is enabled, the voltage at 210 is at or near ground. The voltage at the I/O port 212 is therefore not below the limiting voltage determined by the voltage drop (the limiting voltage) across the limiter circuit.

In a particular embodiment of the present disclosure, the voltage across the limiter circuit includes a voltage generated by the voltage across a resistive component 204. This allows the limiting voltage to vary according to the current through the limiter circuit. For instance, an open drain bus can use a pull-up element (e.g., a pull-up resistor or a current source) to set the operating voltage of the bus. The resistive component 204 forms a voltage divider network with external components, such as the pull-up element (e.g., component 202). This voltage divider defines the limiting voltage. Thus, the limiter circuit would generate a voltage according to the following formula. The limiting voltage (Vol) is defined as:

$$Vol = VDD2 * R2/(R2+R1)$$

where R1=the pull-up component 202, VDD2=the operating voltage, and R2=the resistive component 204. This formula assumes that the ON resistance of the output driver is small compared to R1 and R2, and can be adjusted accordingly if this assumption is incorrect or more precision is desired. Vol scales with VDD2 and can be particularly useful for low-voltage supply levels and bus operating voltages.

Consistent with various embodiments of the present disclosure, additional (optional) circuit components (e.g., additional resistive components or current sources), can be used to set/adjust the value of Vol. Moreover, certain embodiments of the present disclosure contemplate the use of a voltage other than VDD2. For instance, an intermediate voltage (e.g., regulated by and/or decoupled from VDD2) could be used in place of a direct connection to VDD2.

Consistent with other embodiments of the present disclosure, the limiting voltage can be generated using active circuit components (e.g., operational amplifiers and/or comparators) configured to adjust the limiting voltage in response to changes in the operating voltage.

Embodiments of the present disclosure are also directed toward the use of a limiting component 206. This limiting component 206 is configured to set an upper limit to the voltage drop across the limiter circuit. In this manner, the limiting voltage is adjusted according to the operating voltage across a first range of voltages, but is held at a set value for a second (higher) range of voltages.

Some embodiments of the present disclosure use a diode element 208 to provide the function of the limiting component 206. The diode element 208 is configured in parallel with the resistive component 204. When the voltage across the resistive component 204 is sufficient to reach the forward voltage of the diode element 208, the diode element 208 is forward biased and shunts excess current. Accordingly, the voltage drop across the resistive component 204 is effectively set to the forward voltage of the diode element 208. At this point the second range of voltages has been reached, and the limiter circuit provides a set value for the limiting voltage (Vol).

Other embodiments of the present disclosure are directed toward the use of elements other than a diode for limiting component 206. For instance, a metal-oxide-semiconductor field effect transistor (MOSFET) can be configured to function similar to a diode (e.g., with its gate connected to its drain). In another instance, a bipolar transistor can be configured to functions similar to a diode (e.g., with its base connected to its collector). Various other circuits and components can be used to provide similar functionality.

Figure 3:
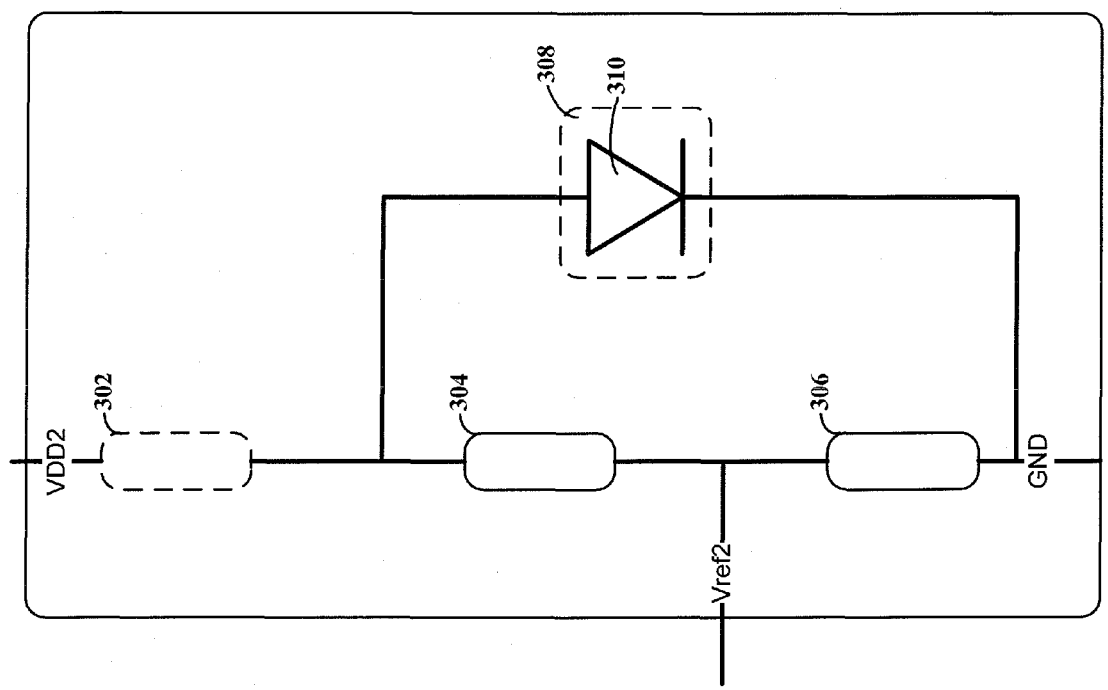
FIG. 3 depicts a voltage reference generator, consistent with an embodiment of the present disclosure.

FIG. 3 depicts a voltage reference generator, consistent with an embodiment of the present disclosure. The voltage reference generator provides an output reference voltage (Vref2) that is compared to the voltage on an I/O port that is limited by a limiter circuit. The voltage reference generator is configured to maintain Vref2 below the limiter voltage (Vol). In certain embodiments, the voltage reference generator is configured so that Vref2 follows Vol over the potential range of operating voltages, albeit at a lower voltage. This can be particularly useful for facilitating the detection of externally-driven signals versus internally-driven signals and thereby mitigating the risk of a deadlock situation.

In a particular embodiment of the present disclosure, the Vref2 is generated by the voltage generated by the combination of resistive components 302, 304 and 306. This allows the reference voltage to vary according to the current through the voltage generator. Thus, the resistive components 302, 304 and 306 form a voltage divider network with an output that is proportional to the operating voltage (e.g., VDD2). Vref2 is thereby generated according to the following formula:

$$Vref2 = VDD2 * R3/(R3+R4+R5)$$

where R3=component 306, R4=component 304, R5=component 302 and VDD2=the operating voltage. This configuration allows Vref2 to scale with VDD2 and can be particularly useful for low-voltage supply levels and bus operating voltages. Consistent with embodiments of the present disclosure, the voltage reference generator is configured with values for resistive components 302, 304 and 306 that satisfy the Vref2<Vol. For instance: $R3/(R3+R4+R5) < R2/(R2+R1)$.

In some embodiments of the present disclosure, a voltage other than VDD2 can be used to generate Vref2. For instance, an intermediate voltage (e.g., regulated by and/or decoupled from VDD2) could be used in place of a direct connection to VDD2.

Other embodiments of the present disclosure recognize that component 302 is optional and can be removed. Vref2 is thereby generated according to the following formula:

$$Vref2=VDD2*R3/(R3+R4)$$

Consistent with various embodiments of the present disclosure, additional (optional) circuit components (e.g., additional resistive components or current sources), can be used to set/adjust the value of Vref2.

Embodiments of the present disclosure are also directed toward the use of a limiting component 308. This limiting component 308 is configured to set an upper limit to the voltage drop across components 304 and 306. This is particularly useful for providing a reference voltage that adjusts according to the operating voltage across a first range of voltages, but is held at a set value for a second (higher) range of voltages.

A specific embodiment of the present disclosure uses a diode element 310 to provide the function of the limiting component 308. The diode element 310 is configured in parallel with the components 304 and 306. When the voltage across the resistive components 304 and 306 is sufficient to reach the forward voltage of the diode element 310, the diode element 310 is forward biased and shunts excess current. Accordingly, the voltage drop across the components 304 and 306 is effectively set to the forward voltage of the diode element 310. At this point, the second range of voltages has been reached and the voltage reference generator provides a set value for the reference voltage (Vref2).

The use of multiple components 304 and 306 in parallel with diode element 310 allows for the generation of the reference voltage at a level that is less than the forward voltage of the diode element 310. For instance, if the components 304 and 306 have resistive values R4 and R3, respectively, then Vref is (subject to various non-idealities, such as diode current at less than the forward voltage) the lesser of:

$$VDD2*R3/(R3+R4+R5);$$

and $$Vforward\_voltage*(R3/(R3+R4)).$$

Other embodiments of the present disclosure are directed toward the use of elements other than a diode limiting component 308. For instance, a metal-oxide-semiconductor field effect transistor (MOSFET) can be configured to function similar to a diode (e.g., with its gate connected to its drain). In another instance, a bipolar transistor can be configured to function similar to a diode (e.g., with its base connected to its collector). Various other circuits and components can be used to provide similar functionality.

Embodiments of the present disclosure are directed toward the use of similar elements for both the limiting circuit and the voltage reference generator, such as using corresponding elements for limiting component 308 and the limiting component 206. This can be particularly useful for mitigating the effects of process and temperature variations. Using a diode as an example, the forward voltage of the diode can vary according to temperature and also vary according to parameters of the manufacturing process, which can be difficult to control. If, however, both of the components 308 and 206 use a similar diode, they are more likely to have closely-matched process parameters and also be subject to the same variations in temperature.

Figure 4:
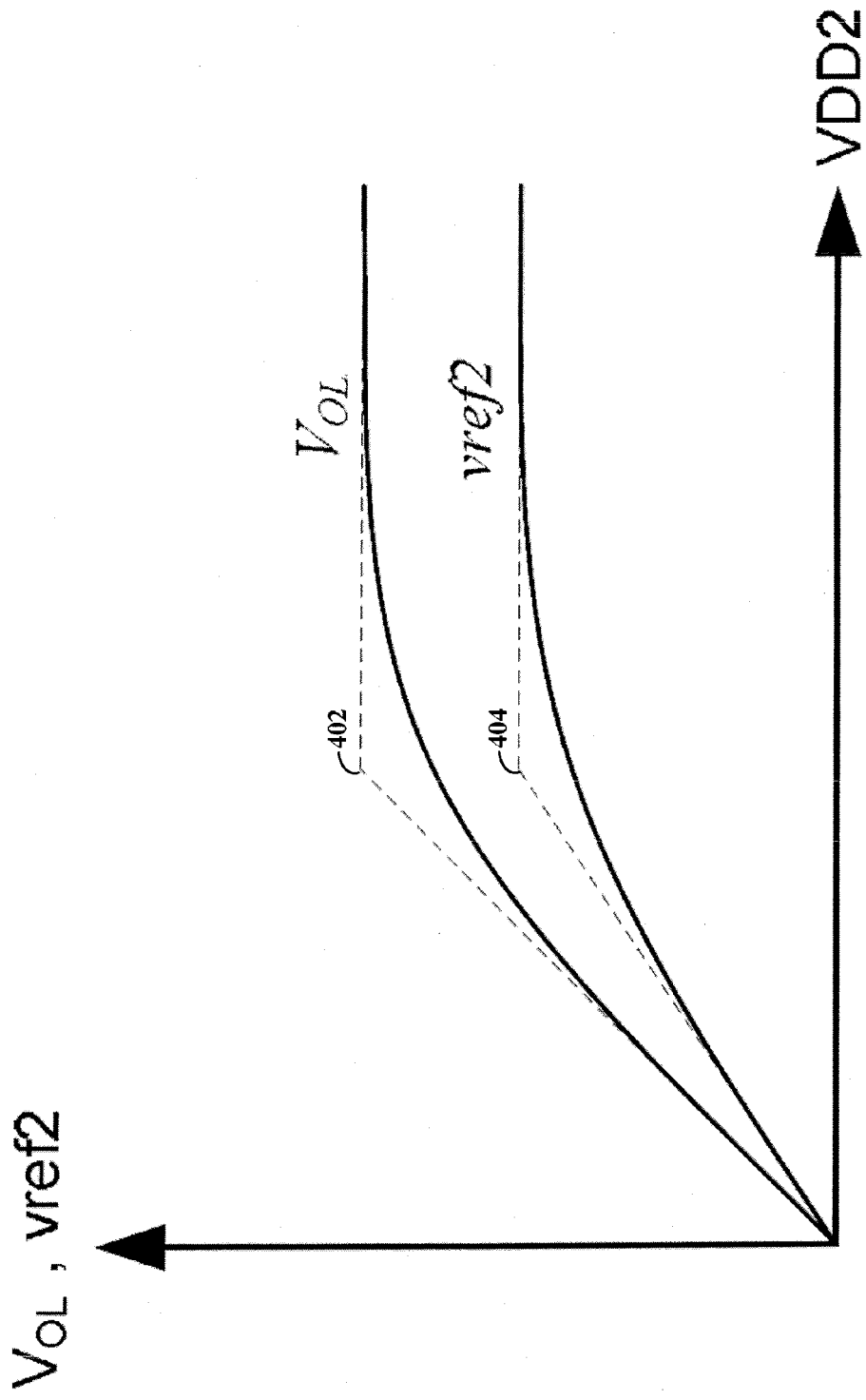
FIG. 4 depicts a graph of voltage responses of a limiter circuit and a voltage reference generator versus an operating voltage, consistent with an embodiment of the present disclosure.

FIG. 4 depicts a graph of voltage responses of a limiter circuit and a voltage reference generator versus an operating voltage, consistent with an embodiment of the present disclosure. The horizontal/X-axis represents the operating voltage (e.g., VDD2) and the vertical/Y-axis represents a corresponding voltage provided by either the limiter circuit or the voltage reference generator. The upper line represents the limiter voltage (Vol) and the lower line represents the reference voltage (Vref2). To mitigate the potential for deadlock, Vref2 is kept below Vol.

The graph of FIG. 4 shows that for low operating voltages Vol is a function of the operating voltage. In particular, Vol scales (nearly) linearly with the operating voltage (VDD2). At point 402, however, the voltage of Vol is limited for increasing values of VDD2. In the embodiment depicted by FIG. 4, a similar behavior is shown for Vref2. Thus, at point 404 (which can be the same VDD2 value as point 402), the voltage of Vref2 is limited for increasing values of VDD2.

It is understood that ideal circuit behavior is difficult to realize and is not necessary for all implementations. As shown in FIG. 4, the dashed lines represent idealized behavior, whereas the solid lines show an example of a less-than-ideal implementation. Moreover, the set value (e.g., the forward voltage of a diode) can be relatively constant while still varying according to factors such as input voltage and temperature variations.

Figure 5:
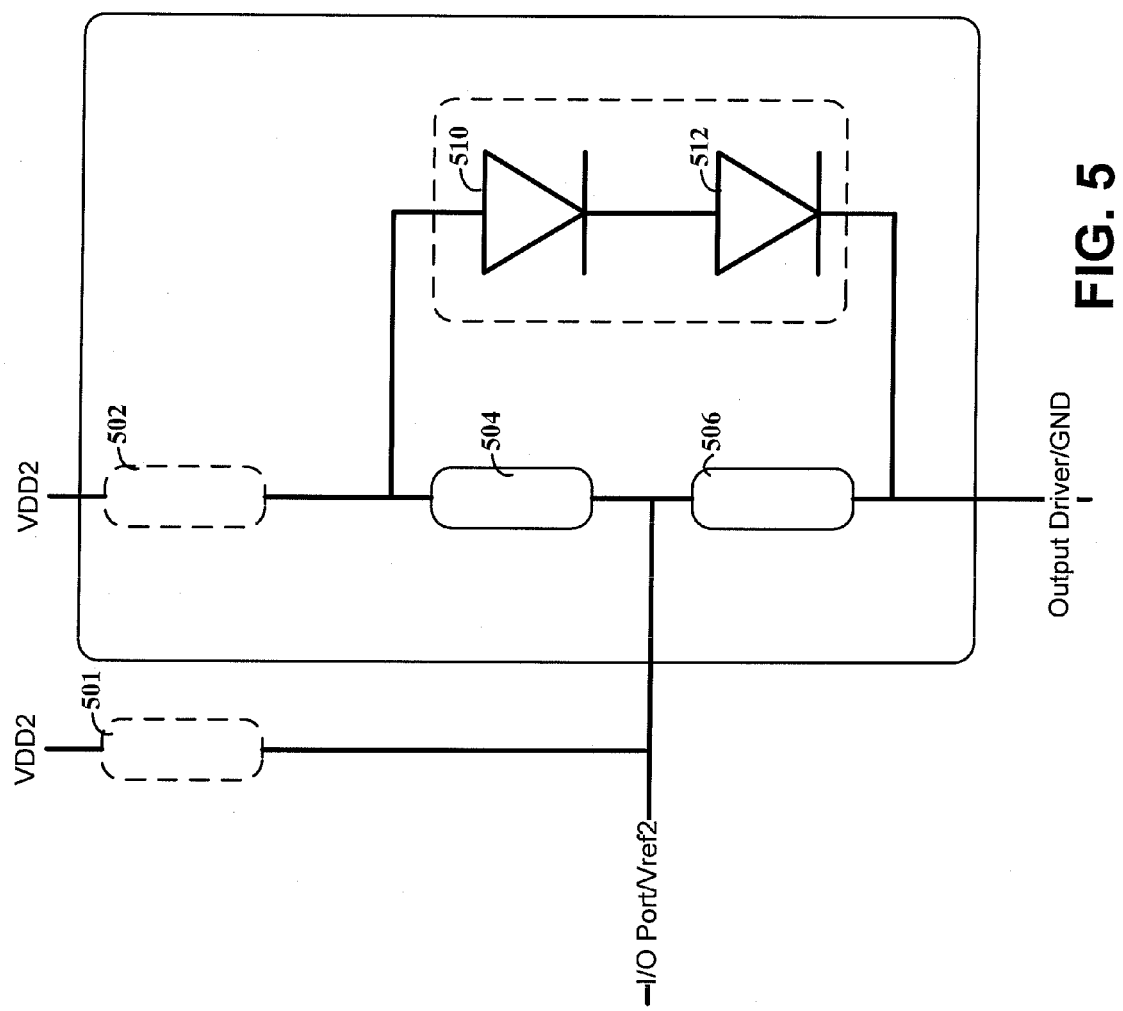
FIG. 5 depicts a limiter circuit and/or voltage reference generator, consistent with an embodiment of the present disclosure.

FIG. 5 depicts a limiter circuit and/or voltage reference generator, consistent with an embodiment of the present disclosure. In certain instances, it may be desirable to have the set value for the limiting voltage (Vol) (or reference voltage (Vref2) to be a value that is greater than or less than the forward voltage of a diode. If the voltage is desired to be more than the forward voltage of a diode, two or more diodes can be used. Alternatively, a set value that is less than the forward voltage can be provided using a voltage divider network in parallel with the diode(s). Consistent therewith, multiple diodes can be used in combination with a voltage divider network to obtain a set value that is larger than a single forward voltage and yet not a multiple thereof.

For a low range of VDD2 values, the output (I/O Port/ Vref2) of the circuit of FIG. 5 operates according to the following formula:

$$Output=VDD2*R9/(1/(1/R6+1/(R7+R8))+R9);$$

where R6=501, R7=502, R8=504 and R9=506.

When VDD2 reaches a higher voltage range (in which diodes 510 and 512 begin conducting) the output (I/O Port/ Vref2) of the circuit of FIG. 5 operates according to the following formula:

$$(2*Vforward\_voltage)*(R9/(R8+R9))$$

Variations as to the number of component elements as well as their specific configuration are possible. Moreover, the use of alternative components (e.g., current sources, diode configure transistors and/or active components) are also possible. According to one embodiment, one or more of the resistive components discussed herein can be provided using PMOS transistors (e.g., operating in linear mode).

Based upon the above discussion and illustrations, those skilled in the art will readily recognize that various modifications and changes may be made without strictly following the exemplary embodiments and applications illustrated and described herein. For example, the voltage levels and protocols are provided by way of example and are not necessarily limiting. Such modifications do not depart from the true spirit and scope of the present disclosure, including that set forth in the following claims.

What is claimed is:

1. A bidirectional level-shifting device for passing signals between input/out (I/O) ports having different signaling levels, the device comprising:
   a first output driver configured and arranged to drive a first I/O port in response to a first control signal;
   a second output driver configured and arranged to drive a second I/O port in response to a second control signal;
   a first comparator circuit, responsive to a first reference voltage and a voltage at the first I/O port, to generate the second control signal;
   a limiter circuit configured and arranged to limit driving of the second I/O port, by the second driver, to a limiting voltage that is adjusted according to a signaling level of the second I/O port over a first range of signaling voltages, and constrained to a set value over a second range of signaling voltages;
   a voltage reference generating circuit configured and arranged to generate a second reference voltage; and
   a second comparator circuit configured and arranged to generate the first control signal in response to a comparison between the second reference voltage and the second I/O port; and
      wherein the limiter circuit includes a voltage divider network that adjusts the limiting voltage according to the signaling level of the second I/O port and a diode that has a forward bias drop that constrains the limiting voltage over the second range of signaling voltages.

2. The device of claim 1, wherein the voltage reference generating circuit is configured to generate the second reference voltage by adjusting the reference voltage according to the signaling level of the second I/O port over a third range of signaling voltages and setting the second reference voltage to a set value over a fourth range of signaling voltages.

3. The device of claim 2, wherein the voltage reference circuit includes a voltage divider network that adjusts the second reference voltage according to the signaling level of the second I/O port and a component that constrains the limiting voltage over the fourth range of signaling voltages, wherein the component is one of a diode that has a forward bias drop, a transistor in a diode configuration, and an active circuit.

4. The device of claim 2, wherein the voltage reference circuit includes a voltage divider network that adjusts the second reference voltage according to the signaling level of the second I/O port and a diode that has a forward bias drop that constrains the reference voltage over the fourth range of signaling voltages.

5. The device of claim 1, wherein the limiter circuit includes a voltage divider network arranged in parallel with at least one diode having a forward voltage, and the voltage divider network sets the limiting voltage to a value that is less than the forward voltage over the second range of signaling voltages.

6. The device of claim 1, wherein the limiter circuit includes a voltage divider network that adjusts the limiting voltage according to the signaling level of the second I/O port and at least two diodes arranged in series to constrain the limiting voltage over the second range of signaling voltages to a value greater than a forward voltage of one of the at least two diodes.

7. The device of claim 2, wherein the voltage reference generating circuit includes a voltage divider network arranged in parallel with at least one diode having a forward voltage, and the voltage divider network sets the limiting voltage to a value that is less than the forward voltage over the fourth range of signaling voltages.

8. The device of claim 2, wherein the voltage reference generating circuit includes a voltage divider network that adjusts the limiting voltage according to the signaling level of the second I/O port and at least two diodes arranged in series to constrain the limiting voltage over the fourth range of signaling voltages to a value greater than a forward voltage of one of the at least two diodes.

9. A method for use with a bidirectional level-shifting device for passing signals between input/output (I/O) ports having different signaling levels, the method comprising:
   using a first output driver to drive a first I/O port in response to a first control signal;
   using a second output driver to drive a second I/O port in response to a second control
   using a first comparator circuit, responsive to a first reference voltage and a voltage at the first I/O port, to generate the second control signal;
   using a limiter circuit arranged to limit driving of the second I/O port, by the second driver, to a limiting voltage that is adjusted according to a signaling level of the second I/O port over a first range of signaling voltages, and constrained to a set value over a second range of signaling voltages;
   using a voltage reference generating circuit to generate a second reference voltage; and
   using a second comparator circuit to generate the first control signal in response to a comparison between the second reference voltage and the second I/O port; and
      wherein the limiter circuit includes a voltage divider network that adjusts the limiting voltage according to the signaling level of the second I/O port and a diode that has a forward bias drop that constrains the limiting voltage over the second range of signaling voltages.

10. The method of claim 9, wherein using the voltage reference generating circuit to generate the second reference voltage includes adjusting the reference voltage according to the signaling level of the second I/O port over a third range of signaling voltages and setting the second reference voltage to a set value over a fourth range of signaling voltages.

11. The method of claim 10, wherein the reference generating circuit includes a voltage divider network that is used to adjust the second reference voltage according to the signaling level of the second I/O port and a component that is used to constrain the reference voltage over the fourth range of signaling voltages, wherein the component is one of a diode that has a forward bias drop, a transistor in a diode configuration, and an active circuit.

12. The method of claim 10, wherein using the reference generating circuit includes using a voltage divider network to adjust the second reference voltage according to the signaling level of the second I/O port and using a diode that has a forward bias drop to constrain the reference voltage over the fourth range of signaling voltages.

* * * * *